United States Patent
Zamanian

[11] Patent Number: 5,633,196
[45] Date of Patent: May 27, 1997

[54] METHOD OF FORMING A BARRIER AND LANDING PAD STRUCTURE IN AN INTEGRATED CIRCUIT

[75] Inventor: Mehdi Zamanian, Carrollton, Tex.

[73] Assignee: SGS-Thomson Microelectronics, Inc., Carrollton, Tex.

[21] Appl. No.: 251,025

[22] Filed: May 31, 1994

[51] Int. Cl.$^6$ .................................................. H01L 21/44
[52] U.S. Cl. ........................ 438/653; 438/655; 438/612
[58] Field of Search ........................ 437/187, 200, 437/194, 195, 189, 192, 228 CON, 245, 246

[56] References Cited

U.S. PATENT DOCUMENTS

| | | | |
|---|---|---|---|
| 4,441,247 | 4/1984 | Gargini et al. | 29/571 |
| 4,707,457 | 11/1987 | Erb | 437/193 |
| 4,789,885 | 12/1988 | Brighton et al. | 357/34 |
| 4,810,666 | 3/1989 | Taji | 437/30 |
| 4,822,749 | 4/1989 | Flanner et al. | 437/41 |
| 4,844,776 | 7/1989 | Lee et al. | 156/653 |
| 4,868,138 | 9/1989 | Chan et al. | 437/4 |
| 4,908,332 | 3/1990 | Wu | 437/192 |

(List continued on next page.)

FOREIGN PATENT DOCUMENTS

| | | | |
|---|---|---|---|
| 0369336A3 | 5/1990 | European Pat. Off. | H01L 21/90 |
| 0499433A2 | 8/1992 | European Pat. Off. | H01L 21/90 |
| 62-136856 | 6/1987 | Japan . | |
| 62-26255 | 11/1987 | Japan . | |
| 304807 | 9/1989 | Japan . | |
| 3016220 | 1/1991 | Japan | H01L 21/3205 |
| 3073531 | 3/1991 | Japan | H01L 21/3205 |
| 4-307732 | 10/1992 | Japan . | |

OTHER PUBLICATIONS

Broadbent, et al., "Selective Low Pressure Chemical Vapor Deposition of Tungstent," J. Electrochem. Soc.: Solid–State Science and Technology, vol. 131, No. 6, Jun. 1984, pp. 1427–1433.

G. Queirolo, et al., "Dopant Activation, Carrier Mobility, and TEM Studies in Polycrystalline Silicon Films", *J. Electrochem. Soc.*, V. 137, No. 3, Mar. 1990, pp. 967–970.

C.S. Pai, et al., "Chemical Vapor Deposition of Selective Epitaxial Silicon Layers", *J. Electrochem.Soc.*, V. 137, No. 3, Mar. 1990, pp. 971–976.

M. Cleeves, et al., "A Novel Disposable Post Technology for Self–Aligned Sub–Micron Contacts", 1994 *IEEE*, 1994 Symposium on VLSI Technology Digest of Technical Papers, pp. 61–62.

*Primary Examiner*—George Fourson
*Assistant Examiner*—C. Everhart
*Attorney, Agent, or Firm*—Theodore E. Galanthay; Lisa K. Jorgenson

[57] ABSTRACT

A method is provided for forming an improved landing pad with barrier of a semiconductor integrated circuit, and an integrated circuit formed according to the same. An opening is formed through a first dielectric layer to expose a portion of a diffused region. A landing pad is formed over the first dielectric layer and in the opening. The landing pad preferably comprises a silicide layer disposed over a barrier layer which is disposed over a polysilicon layer. The landing pad will provide for smaller geometries and meet stringent design rules such as that for contact space to gate. The barrier layer, formed as part of the landing pad, will provide for a uniform and high integrity barrier layer between the diffused region and an overlying aluminum contact to prevent junction spiking. A second dielectric having an opening therethrough is formed over the landing pad. A conductive contact, such as aluminum, is formed in the contact opening. The conductive contact will connect with the diffused region through the landing pad. Misalignment of the conductive contact opening may be tolerated without invading design rules.

18 Claims, 3 Drawing Sheets

U.S. PATENT DOCUMENTS

| | | | |
|---|---|---|---|
| 4,916,397 | 4/1990 | Masuda et al. | |
| 4,922,311 | 5/1990 | Lee et al. | 357/23.1 |
| 4,984,056 | 1/1991 | Fujimoto et al. | |
| 4,997,790 | 3/1991 | Woo et al. | 437/195 |
| 5,036,383 | 7/1991 | Mori. | |
| 5,071,783 | 12/1991 | Taguchi et al. | 437/52 |
| 5,110,752 | 5/1992 | Lu | 437/47 |
| 5,158,910 | 10/1992 | Cooper et al. | 437/195 |
| 5,210,429 | 5/1993 | Adan | 257/67 |
| 5,219,789 | 6/1993 | Adan | 437/192 |
| 5,229,326 | 7/1993 | Dennison et al. | 437/195 |
| 5,247,199 | 9/1993 | Matlock | 257/371 |
| 5,275,972 | 1/1994 | Ogawa et al. | 437/195 |
| 5,298,463 | 3/1994 | Sandhu et al. | 437/192 |
| 5,298,792 | 3/1994 | Manning | 257/758 |
| 5,308,795 | 5/1994 | Hawley et al. | 437/192 |
| 5,316,976 | 5/1994 | Bourg, Jr. et al. | 437/195 |
| 5,359,226 | 10/1994 | DeJong | 257/773 |
| 5,420,058 | 5/1995 | Lee et al. | 437/41 |
| 5,514,622 | 5/1996 | Bornstein et al. | 437/189 |

METHOD OF FORMING A BARRIER AND LANDING PAD STRUCTURE IN AN INTEGRATED CIRCUIT

FIELD OF THE INVENTION

The present invention relates generally to semiconductor integrated circuit processing, and more specifically to an improved method of forming a landing pad structure comprising a barrier film.

BACKGROUND OF THE INVENTION

Design rules are required in integrated circuit design which allow for variations in the fabrication processes to protect against catastrophic failures and to guarantee the electrical parameters of the devices; the electrical parameters being determined by the physical dimensions of the features. Certain feature sizes and minimum space or design tolerance must be maintained between devices in order to maintain the electrical integrity of the devices. Shapes and sizes may vary as a result of, for example, mask misalignment or variations in photoresist exposure. The size of the features may also change during the operation of the circuit. Design rules have thus been established for the various types of material used and the particular location of the devices on the chip, for example, width and spacing rules exist for metal, diffusion and polysilicon materials as well as for contact openings such as a metal contact space to gate. Any misalignment in the formation of a metal contact, for example to a diffused region, may invade the required space between the contact and a surrounding device such as the polysilicon gate. Thus, reduction in the minimum required spacing will not meet the design tolerance and will not insure the devices' electrical characteristics.

To avoid the misalignment and spacing problems between, for example, the metal contact and gate, a landing pad may be formed between the metal contact and the underlying diffused region. The landing pad may be formed from a polysilicon layer over which a silicide layer may be formed to decrease sheet resistance. Due to the design rules for polysilicon, the landing pad will allow for a reduction in the size of the cell and tolerate greater misalignment problems. The landing pad, however, creates a topography problem for subsequently formed layers. The contact opening formed over the landing pad has a higher aspect ratio than an opening formed without a landing pad; the aspect ratio being the height of the contact opening divided by the width of the opening. The larger the aspect ratio, the more difficult it will be to fill a contact opening.

An additional problem in the field of integrated circuit manufacture, particularly with the continuing trend toward smaller integrated circuit feature sizes, is the making of high-reliability conductive electrical contacts between metallization layers and semiconductor elements, particularly contacts between aluminum and diffused junctions into single-crystal silicon. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause aluminum atoms to diffuse from a metal electrode of pure aluminum atoms into single-crystal silicon to such a depth as to short out a shallow p-n junction in the silicon. This phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

Accordingly, recent advances in the field of integrated circuit fabrication have been made by the introduction of so-called "barrier" layers at the aluminum-silicon interface. Conventionally, the barrier layer is a refractory metal compound such as titanium-tungsten (TiW), or a refractory metal nitride such as titanium nitride (TiN). The barrier layer is formed at the contact location so as to be disposed between the silicon and the overlying aluminum layer. In some cases, the barrier layer is formed by deposition of the refractory metal, followed by an anneal which forms both the barrier layer compound and also a metal silicide where the metal is in contact with the silicon; as is known in the art, the metal silicide improves the conductivity of the contact. In any case, the barrier layer inhibits the interdiffusion of aluminum and silicon atoms, thus eliminating the problems of junction spiking and silicon nodule formation noted above.

While a barrier layer eliminates the problems associated with aluminum in direct contact with silicon, it is difficult to form a uniform barrier in contact openings that have a large aspect ratio such as that in contact with a landing pad. Even with today's deposition technology, it is often hard to uniformly coat all sides in an opening, particularly in the corners of the openings. If the barrier layer is not thick enough, pin holes may result from inadequate coverage, resulting in the junction spiking problem noted above, to occur.

It is therefore an object of the present invention to provide a method of forming an integrated circuit in which a high integrity barrier layer is formed in conjunction with a landing pad in such a manner as to reduce the cell size.

It is a further object of the present invention to provide such a method that provides adequate barrier protection under a contact opening having a high aspect ratio.

It is yet a further object of the present invention to provide such a method that tolerates misalignment of subsequently formed contact openings.

Other objects and advantages of the present method will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. An active or diffused region is formed on a substrate. A first dielectric layer having an opening therethrough is formed over the active region. The first dielectric may comprise an oxide layer. A landing pad is formed over the first dielectric and in the opening. The landing pad is preferably formed of a polysilicon layer disposed under a barrier layer which is disposed under silicide layer. Alternatively, the silicide layer may be formed over the polysilicon layer and under the barrier layer. The barrier layer is preferably formed of a refractory metal or refractory metal nitride, for example, titanium or titanium nitride. Alternatively, the barrier layer may be formed of a refractory metal nitride overlying a refractory metal. A second dielectric layer having an opening therethrough is formed over the landing pad. A conductive material, for example, an aluminum alloy, is formed in the opening in the second dielectric layer. The conductive material makes contact with the diffused region through the landing pad.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Referring now to FIGS. 1–5, a method of fabricating an integrated circuit to have a landing pad with barrier layer according to a first embodiment of the present invention will now be described in detail. The cross-sections of FIGS. 1–5 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1:
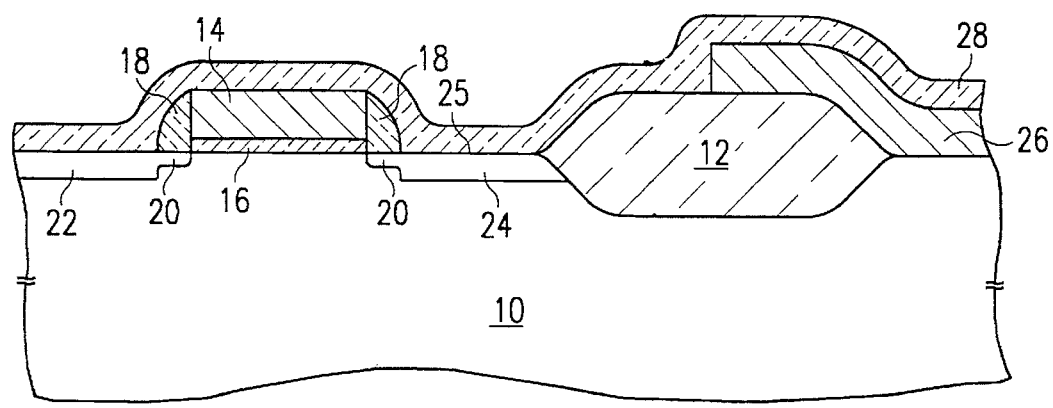
FIGS. 1–5 are cross-sectional views of the fabrication of a semiconductor integrated circuit according to one embodiment of the present invention.

FIG. 1 illustrates, in cross-section, a portion of an integrated circuit that has been partially fabricated. According to the example described herein, the present invention is directed to forming a landing pad with a barrier layer between an aluminum metallization layer and a doped semiconductor region in single-crystal silicon, as such contacts are generally the most sensitive to the misalignment and design rules for spacing addressed by the landing pad and the spiking and nodule problems addressed by the barrier layer. It is contemplated, of course, that the present invention will also be applicable to the formation of other contacts, including, for example, contacts between metallization and polysilicon.

The structure of FIG. 1, includes silicon substrate 10, into a surface of and above which is a field oxide region 12 for separating active regions or devices. Various active devices may be formed on or in the surface of the substrate as well as overlying the field oxide region 12. In a particular application, a gate electrode 14, formed from a first layer of polysilicon, is shown overlying a gate oxide 16. As is known in the art, typically gate electrode 14 will have sidewall oxide spacers 18, lightly doped drain regions 20 and source and drain or diffused regions 22, 24. Diffused region 24 may form a shared contact 25 between devices as is known in the art. Also from the first polysilicon layer may be formed an interconnect 26 which may partially overlie field oxide region 12.

The diffused or active region 24 is formed of opposite conductivity type from that of substrate 10. For example, substrate 10 may be lightly doped p-type silicon and diffusion region 24 may be heavily doped n-type silicon. Of course, as noted above, other structures (with the same or opposite conductivity type selection) may alternatively be used; for example, substrate 10 may instead be a well or tub region in a CMOS process, into which diffusion or active region 24 is formed. In the example of FIG. 1, diffusion 24 is bounded by field oxide region 12, formed in the conventional manner. In this example, diffusion 24 is very shallow, such as on the order of 0.15 microns, as is conventional for modern integrated circuits having sub-micron feature sizes. As such, diffusion 24 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

Dielectric layer 28, which may be a deposited oxide or another type of dielectric layer, is formed over diffusion 24, field oxide region 12 and other already formed devices such as gate electrode 14 and interconnect 26. Dielectric layer 28, formed for purposes of electrically isolating overlying conductive structures from diffusion 24 and other devices except at locations where contacts are desired therebetween, may have a thickness of about 500 to 2000 angstroms.

Figure 2:
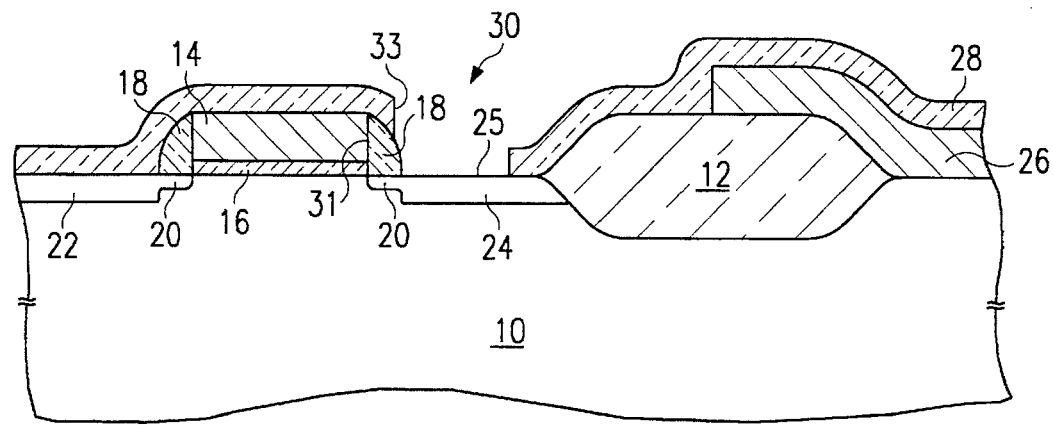

As shown in FIG. 2, contact opening 30 is formed through dielectric layer 28, for example by way of reactive ion etching or another type of anisotropic etching; as will be apparent below, this embodiment of the invention is concerned with the formation of an overlying landing pad and barrier structure that is in contact with diffusion 24 and under an overlying metallization layer subsequently formed in a contact opening. In this example, any misalignment of the contact opening 30 may decrease the contact space between the edge 31 of gate electrode 14 and the side 34 of the contact opening. Due to the misalignment of the contact opening, in this example, effectively opening over the sidewall spacer 18, the distance between these active areas may be reduced enough such that the design rules for a metal contact space to gate cannot be tolerated to insure device integrity. Thus, another material is formed in contact opening 30 whereby the design rules for contact space or side of contact 34 to gate or edge 31 are met.

Figure 3:
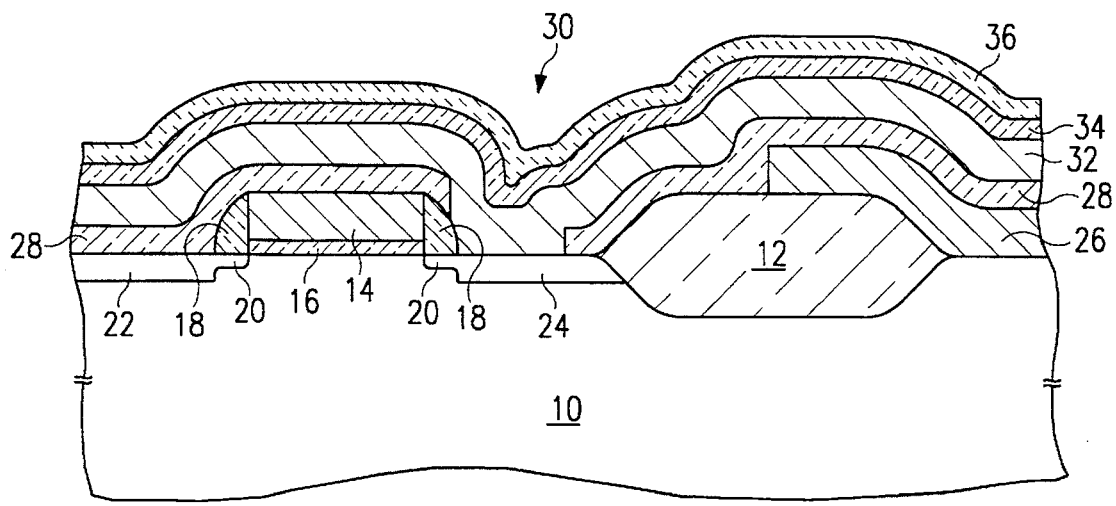

Referring now to FIG. 3, a polysilicon layer 32 is formed over dielectric layer 28 and in the contact opening 30 in contact with the diffused region 24. Polysilicon layer 28 is doped with a similar dopant as the diffused region 24, such as by ion implantation or other suitable method. Polysilicon layer 32 will have a thickness of between approximately 500 to 2000 angstroms. A thin barrier layer 34 of a refractory metal or refractory metal nitride is deposited over the polysilicon layer 32, preferably formed by way of sputtering, to a thickness of about 400 to 1000 angstroms. Barrier layer 34 is preferably formed of titanium nitride or other suitable refractory metal nitride, or may be formed of titanium, titanium-tungsten, or other suitable refractory metal. The barrier layer may alternatively be formed of a refractory metal nitride over a refractory metal, for example, a titanium nitride may be formed over a titanium layer. The material and thickness of barrier layer 34 are selected according to optimized process conditions to prevent diffusion of atoms between the diffused region 24 and an overlying conductive layer to be subsequently formed. Following the deposition of barrier layer 34, a silicide layer 36 is formed over barrier layer 34 to lower the overall sheet resistance of the underlying layers. For a particular application, silicide layer 36 is preferably formed of tantalum disilicide ($TaSi_2$) or tungsten disilicide ($WSi_2$) by sputter deposition to a thickness of about 500 to 2000 angstroms.

Figure 4:
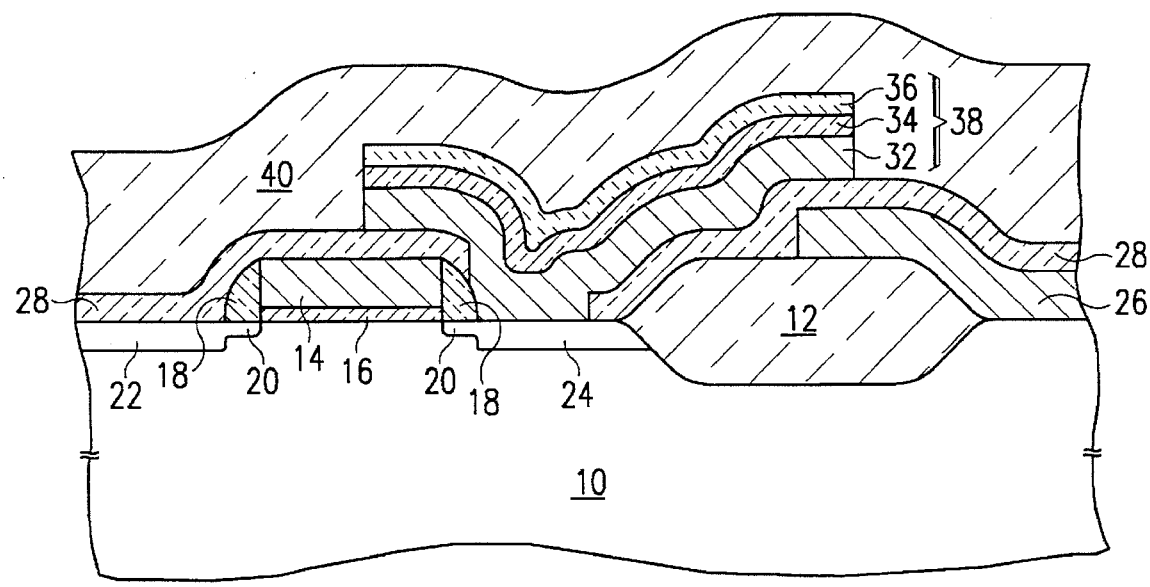

Referring to FIG. 4, polysilicon layer 32, barrier layer 34 and silicide layer 36 are patterned and etched to form a composite landing pad 38. Landing pad 38 will provide for proper design rules for spacing such as that between the contact in opening 30 and gate 14 caused by such factors as misalignment and smaller required geometries. The advantages of forming barrier layer 34 as part of the composite landing pad 38 will be described below.

Figure 5:
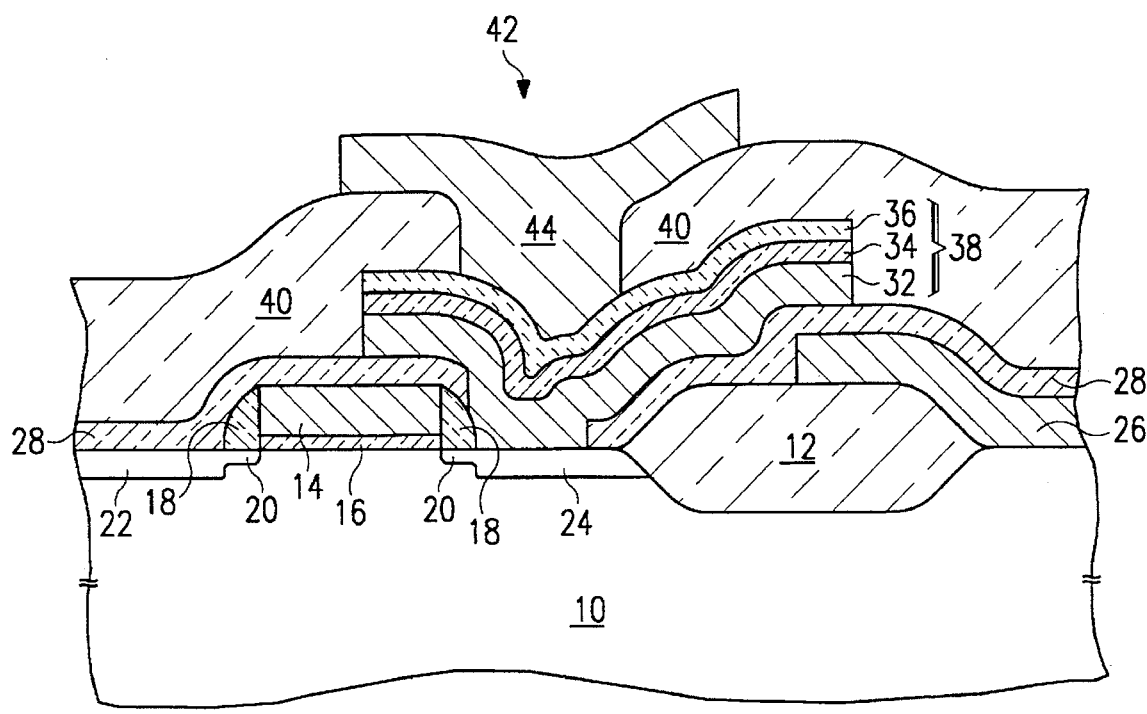

Referring to FIG. 5, a second dielectric layer 40 is formed over the landing pad 38 and first dielectric layer 28. The second dielectric layer 40 may be, for example, a multi-layer film or a glass layer such as spin-on-glass or borophosphorous silicate glass (BPSG) to aid in planarization of the surface of the wafer at this stage of processing. Dielectric layer 40 will have a thickness dependent upon the underlying topography and may be between approximately 6000 to 12000 angstroms. An opening 42 is formed through the dielectric layer 40 exposing a portion of the landing pad 38. If BPSG is used for the dielectric layer 40, as is known in the art, it will typically be reflowed to round the corners at the opening 42. A conductive layer is formed over the dielectric layer 40, patterned and etched to form a conductive contact 44. Contact 44 is typically aluminum which makes electrical connection to diffused region 24, in this case, through landing pad 38. The width of the contact opening 42 is not as critical as the previous contact opening 30 to diffused region 24. With the landing pad formed between the contact 44 and gate 14, the design rules for contact to gate spacing are not invaded by the conductive contact 44. A wider contact opening may thus be formed to facilitate the deposition of a contact metal such as aluminum or other suitable contact metal such as tungsten. In addition, some misalignment of contact opening 42 over the landing pad 38 will also be tolerated without invalidating design rules.

The barrier layer 34, formed as part of the landing pad 38, is disposed between the silicon or diffused region 24 and the overlying aluminum layer 44. The silicide layer 36 overlying the barrier layer 34 improves the conductivity of the contact and the polysilicon layer 32. The barrier layer 34 inhibits the interdiffusion of aluminum and silicon atoms, thus eliminating the possibility of junction spiking. One of the advantages of forming the barrier layer as part of the landing pad is that it can be uniformly formed over the polysilicon layer to provide adequate coverage of the barrier layer below the aluminum. The landing pad creates additional topography under the contact opening such that if the barrier layer were formed in the contact opening 42, there may be inadequate coverage of the barrier layer at the bottom of the contact opening. Inadequate coverage at the bottom of the contact opening may result in pinholes in the barrier layer allowing the aluminum and silicon atoms to interdiffuse thus causing junction spiking. The barrier layer formed within the landing pad will provide for uniform thickness of the barrier layer under the aluminum contact and prevent junction spiking.

Figure 6:
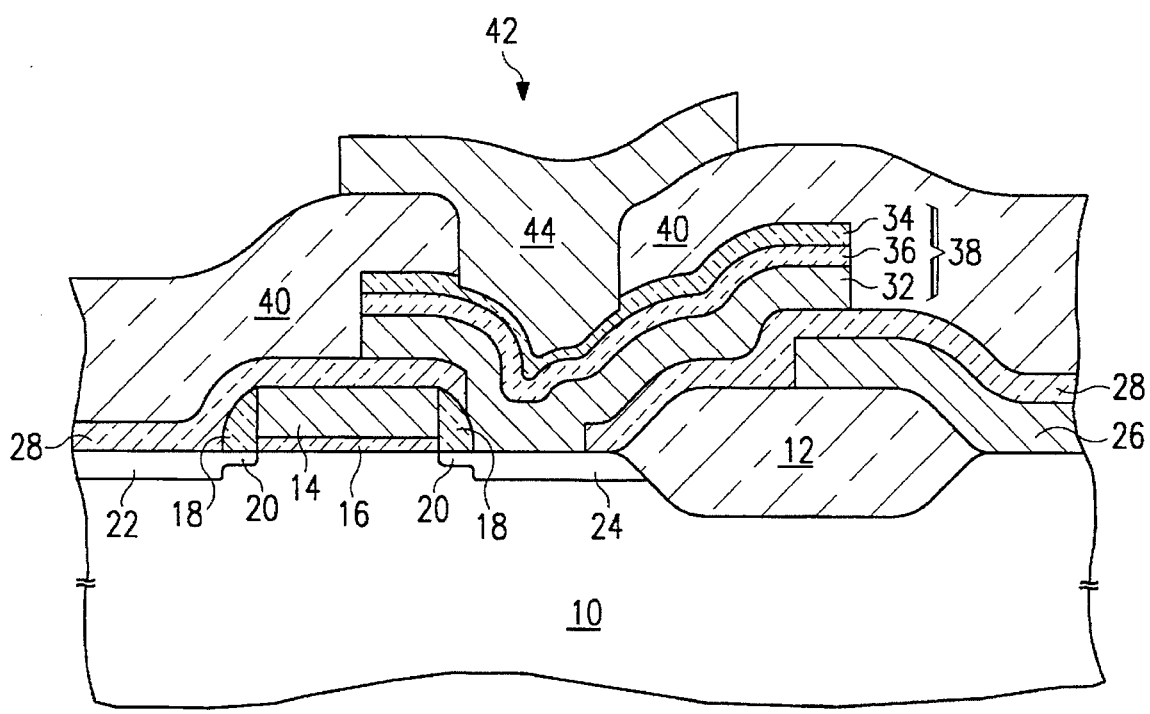
FIG. 6 is a cross-sectional view of the fabrication of a semiconductor integrated circuit according to an alternative embodiment of the present invention.

Referring to FIG. 6, an alternative embodiment of the present invention is shown. Similar reference numerals will be used to identify similar layers or regions as described above with reference to FIGS. 1–5 and the corresponding text. The steps of forming the oxide layer 28, opening 30 and polysilicon layer 32 are as described above. The silicide layer 36 is next formed over the polysilicon layer 32. The barrier layer 34 is formed over the silicide layer 36. Thus, the formation of the silicide layer 36 over the polysilicon reduces the sheet resistance and improves conductivity. The barrier layer 34 is uniformly formed over the silicide layer 36. Dielectric layer 40, contact opening 42 and conductive contact 44 are formed as described above. The barrier layer 34, formed over the silicide layer 36, is in the bottom of the contact opening underlying the aluminum layer 44. Similar advantages of the landing pad with the barrier layer formed as part of the landing pad remain. A consideration, however, in forming the barrier layer over the silicide layer, is the required overetch of the dielectric layer 40 to insure that all of the dielectric has been removed from the contact opening 42. Overetching of the dielectric layer may etch away part or all of the barrier layer 34 in the opening. Consideration should be given as to which materials are to be used for the barrier layer. For example, if titanium nitride is formed over titanium, overetching the dielectric layer 40 may remove the titanium nitride but leave the titanium in tact. Another consideration is the reflow temperature of the BPSG dielectric layer 40. The higher the processing temperature, the more likely it will be that the barrier layer 34 will interact with the underlying layer which may increase the resistance of the landing pad beyond desirable limits. Thus, the lower the reflow temperature used, the lower will be the resistance.

As described above, the composite landing pad with barrier layer will provide for smaller design rules such as that for contact space to gate, while also providing for a high integrity barrier between the aluminum contact and active or diffused region. The preferred and alternative embodiments of the present invention are directed to novel methods of forming a landing pad with a barrier layer to provide the required barrier performance and maintain desired design rules.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a portion of a semiconductor integrated circuit; comprising the steps of:

forming an active region on a substrate;

forming a first dielectric layer having a first opening therethrough exposing a portion of the active region;

forming a landing pad over the exposed portion of the active region and a portion of the first dielectric layer wherein the landing pad comprises a metal silicide/ metal composite bilayer overlying a polysilicon layer;

forming a second dielectric layer over the landing pad and a portion of the first dielectric layer, wherein the second dielectric layer has a second opening therethrough exposing a portion of the landing pad; and forming a conductive layer in the second opening and over a portion of the second dielectric layer.

2. The method of claim 1, wherein the active region is a shared contact in an upper portion of the substrate.

3. The method of claim 1, wherein the step of forming a metal silicide/metal composite layer further comprises:

forming a refractory metal over the polysilicon; and forming a refractory metal silicide over the refractory metal.

4. The method of claim 1, wherein the step of forming a metal silicide/metal composite layer further comprises:

forming a refractory metal silicide over the polysilicon; and forming a refractory metal over the refractory metal silicide.

5. The method of claim 1, wherein the landing pad has a thickness of about 1400 to 5,000 angstroms.

6. The method of claim 1, wherein the metal silicide/metal composite bilayer has a thickness of about 900 to 3000 angstroms.

7. The method of claim 1, wherein the first dielectric layer comprises oxide.

8. The method of claim 1, wherein the first dielectric layer has a thickness of about 500 to 2000 angstroms.

9. The method of claim 1, wherein the second dielectric layer comprises BPSG.

10. The method of claim 1, wherein the second dielectric layer has a thickness of about 6000 to 12000 angstroms.

11. A method of forming a portion of a semiconductor integrated circuit; comprising the steps of:

forming an active region on a substrate;

forming a first dielectric layer over the active region;

patterning and etching the first dielectric layer to form an opening exposing a portion of the active region;

forming a doped polysilicon layer over the exposed portion of the active region;

forming a metal/silicide composite layer over the polysilicon layer;

patterning and etching the metal/silicide composite layer and polysilicon layer to form a landing pad;

forming a second dielectric layer over the metal/silicide composite layer and first dielectric layer not covered by the metal/silicide composite layer and polysilicon layer;

patterning and etching the second dielectric layer to form an opening exposing a portion of the metal/silicide composite layer; and forming a conductive layer in the second opening and on a portion of the second dielectric layer.

12. The method of claim 11, wherein the step of forming a metal silicide composite layer further comprises the steps of:

forming a refractory metal silicide over a refractory metal or refractory metal compound barrier layer.

13. The method of claim 12, wherein the refractory metal or refractory metal compound barrier layer comprises titanium.

14. The method of claim 12, wherein the refractory metal or refractory metal compound barrier layer comprises titanium nitride.

15. The method of claim 12, wherein the refractory metal or refractory metal compound barrier layer comprises a refractory metal nitride overlying a refractory metal.

16. The method of claim 15, wherein the refractory metal or refractory metal compound barrier layer comprises a titanium nitride overlying titanium.

17. The method of claim 11, wherein the step of forming a metal silicide composite layer further comprises the steps of:

forming a refractory metal barrier layer over a refractory metal silicide layer.

18. The method of claim 11, wherein the conductive layer comprises an aluminum alloy.

* * * * *